US012628573B2

(12) United States Patent
Buzi et al.

(10) Patent No.: US 12,628,573 B2
(45) Date of Patent: May 12, 2026

(54) TRIMMING INTERMEDIATE CARBON LAYER TO ACHIEVE NANOMETER SCALE PATTERNING

(71) Applicant: International Business Machines Corporation, Armonk, NY (US)

(72) Inventors: Luxherta Buzi, Chappaqua, NY (US); Robert L. Bruce, White Plains, NY (US); Hiroyuki Miyazoe, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 385 days.

(21) Appl. No.: 18/527,463

(22) Filed: Dec. 4, 2023

(65) Prior Publication Data

US 2025/0185524 A1     Jun. 5, 2025

(51) Int. Cl.
H10N 70/00        (2023.01)
H10B 63/10        (2023.01)
(52) U.S. Cl.
CPC ........... H10N 70/068 (2023.02); H10B 63/10 (2023.02)
(58) Field of Classification Search
CPC ........ H10B 63/00; H10B 63/10; H10B 63/24; H10N 70/068; H10P 50/20; H10P 50/28; H10P 50/282; H10P 50/71; H10P 50/73; H10P 76/40; H10P 76/405; H10P 76/408–4088; H01L 21/3065; H01L 21/30655; H01L 21/308; H01L 21/3081; H01L 21/3083; H01L 21/3086; H01L 21/3088
See application file for complete search history.

(56) References Cited

U.S. PATENT DOCUMENTS 6,064,118  A     5/2000  Sasaki
7,371,634  B2    5/2008  Chiang et al.
(Continued)

FOREIGN PATENT DOCUMENTS

CN       108110222  A     6/2018
CN       112242547  A     1/2021
KR       101068149  B1    9/2011

OTHER PUBLICATIONS

Gambino et al., "Selective Etching of Carbon From Silicon Surfaces," ip.com, IPCOM000053007D, Feb. 12, 2005, 5 pages.

*Primary Examiner* — Evan G Clinton
*Assistant Examiner* — Douglas Yap
(74) *Attorney, Agent, or Firm* — CANTOR COLBURN LLP; Samuel Waldbaum

(57)                ABSTRACT

Embodiments of include a technique for trimming an intermediate carbon layer by hydrogen (H$_2$) plasma to achieve nanometer scale critical dimension patterning with high selectivity to metals and dielectrics. The technique includes providing a structure as a stack having at least one metal layer, a carbon layer, and at least one phase change material layer, the stack extending in a first dimension. The technique includes etching the carbon layer to a first width in a second dimension, the second dimension being perpendicular to the first dimension. The technique includes applying hydrogen plasma to laterally etch the carbon layer to a second width in the second dimension, the hydrogen plasma being applied with substantially no bias power and to avoid etching the at least one metal layer and the at least one phase change material layer.

20 Claims, 5 Drawing Sheets

(56)             References Cited

U.S. PATENT DOCUMENTS

| | | |
|---|---|---|
| 8,664,657 B2 | 3/2014 | Duesberg et al. |
| 9,236,488 B2 | 1/2016 | Kawahara et al. |
| 9,607,840 B2 | 3/2017 | Posseme |
| 10,763,307 B1 * | 9/2020 | Carta ................... H10N 70/068 |
| 11,456,413 B2 | 9/2022 | Yogendra et al. |
| 2017/0084467 A1 * | 3/2017 | Oomori ................ H10P 50/285 |

* cited by examiner

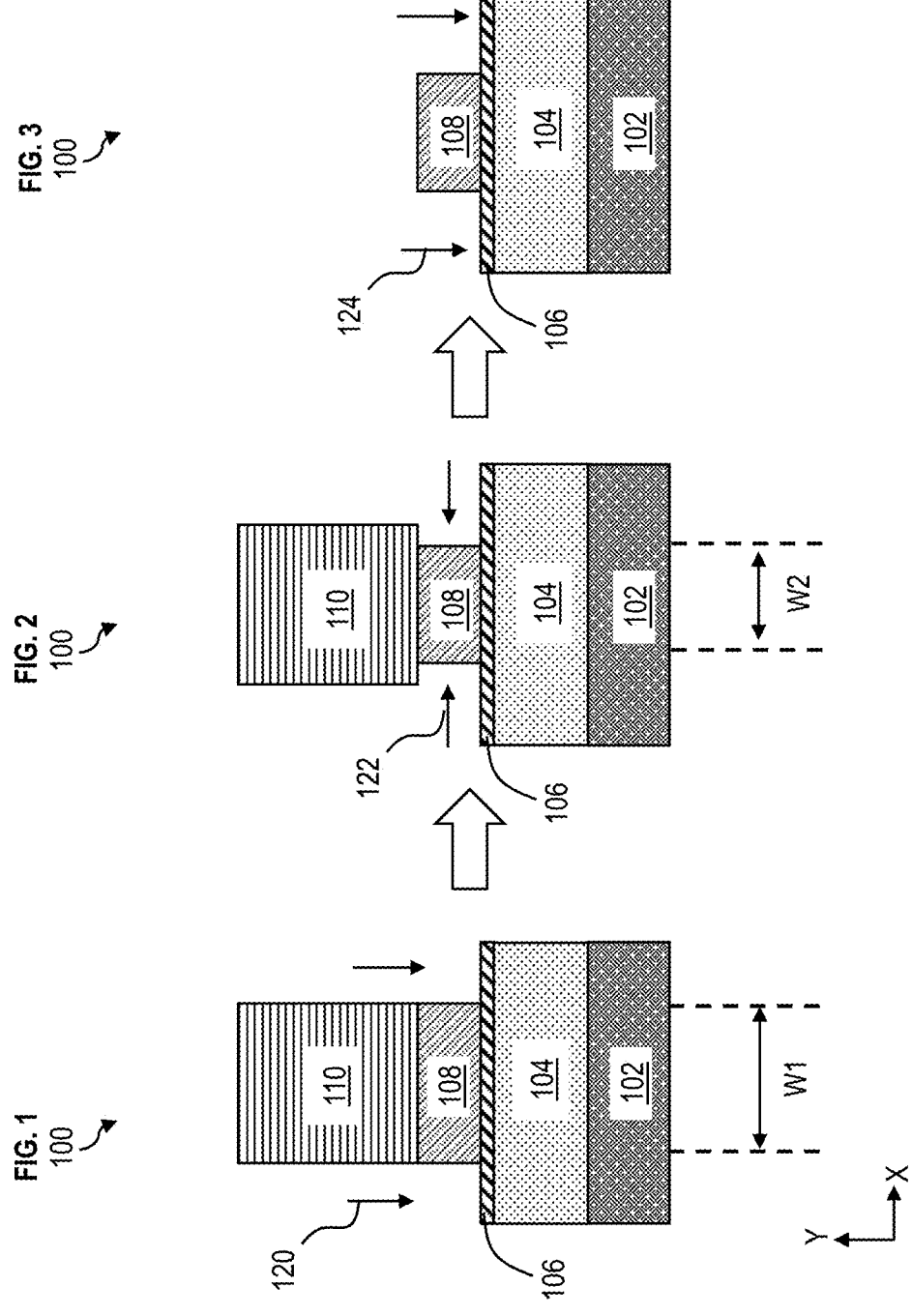

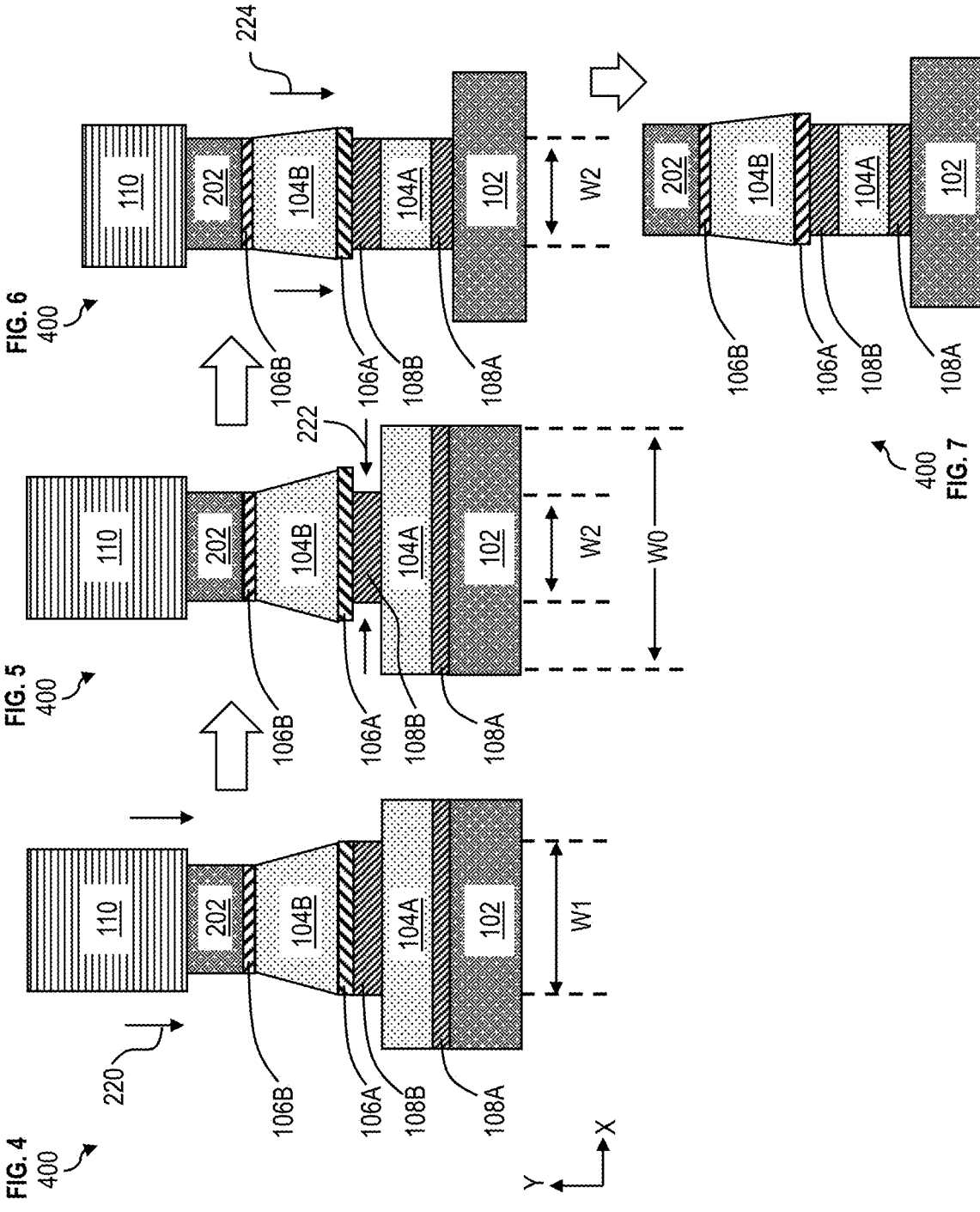

FIG. 8
800

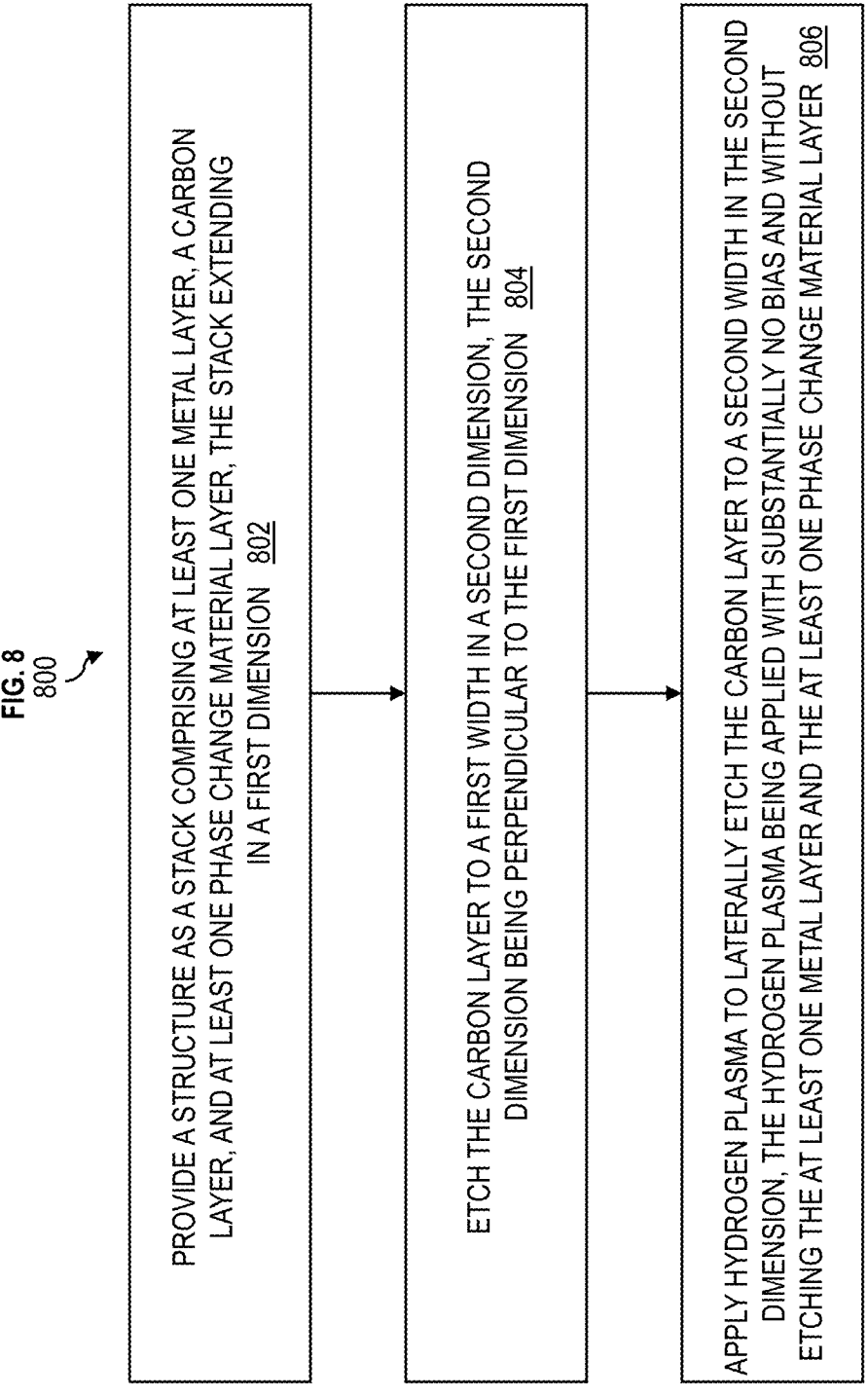

PROVIDE A STRUCTURE AS A STACK COMPRISING AT LEAST ONE METAL LAYER, A CARBON LAYER, AND AT LEAST ONE PHASE CHANGE MATERIAL LAYER, THE STACK EXTENDING IN A FIRST DIMENSION  802

ETCH THE CARBON LAYER TO A FIRST WIDTH IN A SECOND DIMENSION, THE SECOND DIMENSION BEING PERPENDICULAR TO THE FIRST DIMENSION  804

APPLY HYDROGEN PLASMA TO LATERALLY ETCH THE CARBON LAYER TO A SECOND WIDTH IN THE SECOND DIMENSION, THE HYDROGEN PLASMA BEING APPLIED WITH SUBSTANTIALLY NO BIAS AND WITHOUT ETCHING THE AT LEAST ONE METAL LAYER AND THE AT LEAST ONE PHASE CHANGE MATERIAL LAYER  806

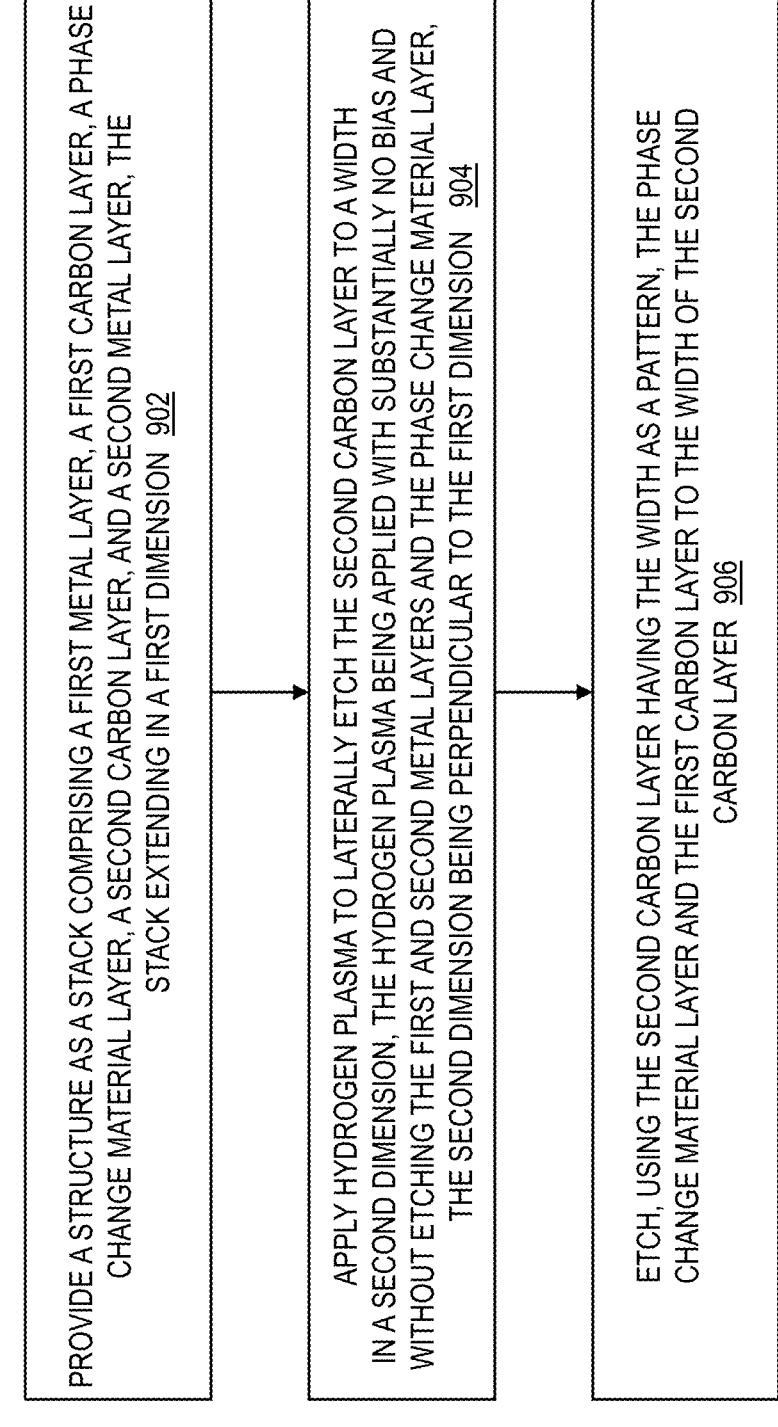

FIG. 9
900

PROVIDE A STRUCTURE AS A STACK COMPRISING A FIRST METAL LAYER, A FIRST CARBON LAYER, A PHASE CHANGE MATERIAL LAYER, A SECOND CARBON LAYER, AND A SECOND METAL LAYER, THE STACK EXTENDING IN A FIRST DIMENSION 902

APPLY HYDROGEN PLASMA TO LATERALLY ETCH THE SECOND CARBON LAYER TO A WIDTH IN A SECOND DIMENSION, THE HYDROGEN PLASMA BEING APPLIED WITH SUBSTANTIALLY NO BIAS AND WITHOUT ETCHING THE FIRST AND SECOND METAL LAYERS AND THE PHASE CHANGE MATERIAL LAYER, THE SECOND DIMENSION BEING PERPENDICULAR TO THE FIRST DIMENSION 904

ETCH, USING THE SECOND CARBON LAYER HAVING THE WIDTH AS A PATTERN, THE PHASE CHANGE MATERIAL LAYER AND THE FIRST CARBON LAYER TO THE WIDTH OF THE SECOND CARBON LAYER 906

FIG. 10
1000

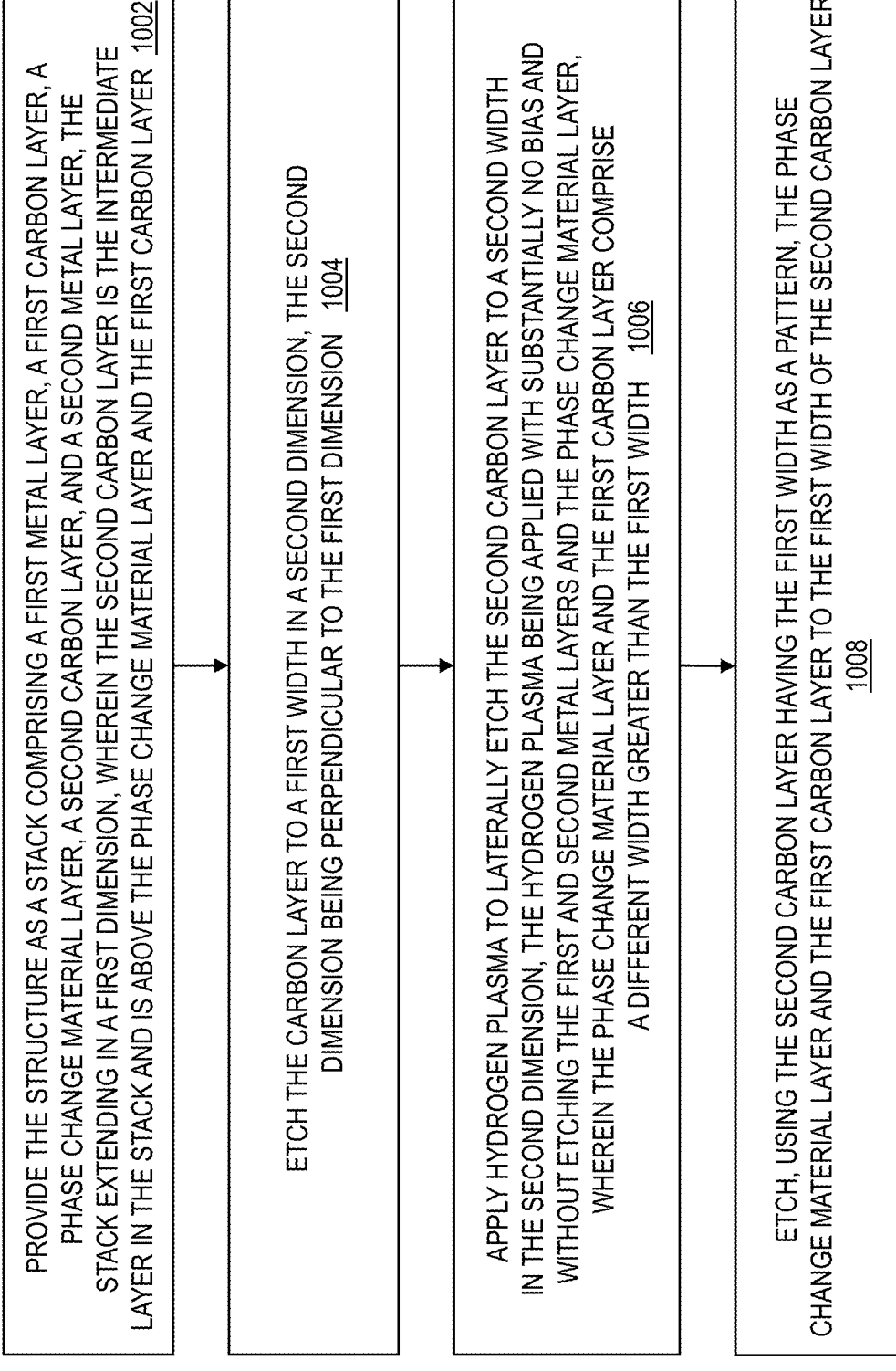

PROVIDE THE STRUCTURE AS A STACK COMPRISING A FIRST METAL LAYER, A FIRST CARBON LAYER, A PHASE CHANGE MATERIAL LAYER, A SECOND CARBON LAYER, AND A SECOND METAL LAYER, THE STACK EXTENDING IN A FIRST DIMENSION, WHEREIN THE SECOND CARBON LAYER IS THE INTERMEDIATE LAYER IN THE STACK AND IS ABOVE THE PHASE CHANGE MATERIAL LAYER AND THE FIRST CARBON LAYER   1002

ETCH THE CARBON LAYER TO A FIRST WIDTH IN A SECOND DIMENSION, THE SECOND DIMENSION BEING PERPENDICULAR TO THE FIRST DIMENSION   1004

APPLY HYDROGEN PLASMA TO LATERALLY ETCH THE SECOND CARBON LAYER TO A SECOND WIDTH IN THE SECOND DIMENSION, THE HYDROGEN PLASMA BEING APPLIED WITH SUBSTANTIALLY NO BIAS AND WITHOUT ETCHING THE FIRST AND SECOND METAL LAYERS AND THE PHASE CHANGE MATERIAL LAYER, WHEREIN THE PHASE CHANGE MATERIAL LAYER AND THE FIRST CARBON LAYER COMPRISE A DIFFERENT WIDTH GREATER THAN THE FIRST WIDTH   1006

ETCH, USING THE SECOND CARBON LAYER HAVING THE FIRST WIDTH AS A PATTERN, THE PHASE CHANGE MATERIAL LAYER AND THE FIRST CARBON LAYER TO THE FIRST WIDTH OF THE SECOND CARBON LAYER
1008

TRIMMING INTERMEDIATE CARBON LAYER TO ACHIEVE NANOMETER SCALE PATTERNING

BACKGROUND

The present invention generally relates to fabrication methods and resulting structures for integrated circuits (ICs), and more specifically, to fabrication methods and resulting structures for trimming an intermediate carbon layer by hydrogen ($H_2$) plasma to achieve nanometer scale critical dimension (CD) patterning with high selectivity to metals and dielectrics.

The relentless race for a reduction in the dimensions that characterize the microelectronics industry is achieved by innovations throughout decades of development. Pillars or stacks of different layers are utilized in the microelectronics, and the size of these pillars are becoming smaller as the size of microelectronics scales down.

SUMMARY

Embodiments of the present invention are directed to trimming an intermediate carbon layer by hydrogen plasma to achieve nanometer scale critical dimension patterning with high selectivity to metals and dielectrics. A non-limiting method includes providing a structure as a stack having at least one metal layer, a carbon layer, and at least one phase change material layer, the stack extending in a first dimension. The method includes etching the carbon layer to a first width in a second dimension, the second dimension being perpendicular to the first dimension. The method includes applying hydrogen plasma to laterally etch the carbon layer to a second width in the second dimension, the hydrogen plasma being applied with substantially no bias power and to avoid etching the at least one metal layer and the at least one phase change material layer.

According to one or more embodiments, a non-limiting method includes providing a structure as a stack having a first metal layer, a first carbon layer, a phase change material layer, a second carbon layer, and a second metal layer, the stack extending in a first dimension. The method includes applying hydrogen plasma to laterally etch the second carbon layer to a width in a second dimension, the hydrogen plasma being applied with substantially no bias power and to avoid etching the first and second metal layers and the phase change material layer, the second dimension being perpendicular to the first dimension. The method includes etching, using the second carbon layer having the width as a pattern, the phase change material layer and the first carbon layer to the width of the second carbon layer.

According to one or more embodiments, a non-limiting method is provided for forming a structure using an intermediate layer to etch layers below. The method includes providing the structure as a stack including a first metal layer, a first carbon layer, a phase change material layer, a second carbon layer, and a second metal layer, the stack extending in a first dimension, where the second carbon layer is the intermediate layer in the stack and is above the phase change material layer and the first carbon layer. The method includes etching the carbon layer to a first width in a second dimension, the second dimension being perpendicular to the first dimension. The method includes applying hydrogen plasma to laterally etch the second carbon layer to a second width in the second dimension, the hydrogen plasma being applied with substantially no bias power and to avoid etching the first and second metal layers and the phase change material layer, where the phase change material layer and the first carbon layer include a different width greater than the first width. The method includes etching, using the second carbon layer having the second width as a pattern, the phase change material layer and the first carbon layer to the second width of the second carbon layer.

Other embodiments of the present invention implement features of the above-described devices/structures in methods and/or implement features of the methods in devices/structures.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1 depicts a cross-sectional view of a flow of fabricating a structure according to one or more embodiments of the invention;

FIG. 2 depicts a cross-sectional view continued from FIG. 1 of the flow of fabricating a structure according to one or more embodiments of the invention;

FIG. 3 depicts a cross-sectional view continued from FIG. 2 of the flow of fabricating a structure according to one or more embodiments of the invention;

FIG. 4 depicts a cross-sectional view of a flow of fabricating a structure according to one or more embodiments of the invention;

FIG. 5 depicts a cross-sectional view continued from FIG. 4 of the flow of fabricating a structure according to one or more embodiments of the invention;

FIG. 6 depicts a cross-sectional view continued from FIG. 5 of the flow of fabricating a structure according to one or more embodiments of the invention;

FIG. 7 depicts a cross-sectional view continued from FIG. 6 of the flow of fabricating a structure according to one or more embodiments of the invention;

FIG. 8 depicts a flowchart of a method of forming a structure according to one or more embodiments of the invention;

FIG. 9 depicts a flowchart of a method of forming a structure according to one or more embodiments of the invention; and FIG. 10 depicts a flowchart of a method of forming a structure according to one or more embodiments of the invention.

DETAILED DESCRIPTION

One or more embodiments of the present invention relate to trimming an intermediate carbon layer in a structure by hydrogen ($H_2$) plasma to achieve nanometer scale critical dimension (CD) patterning with high selectivity to metal layers and dielectric layers in the structure. A non-limiting method includes providing a structure as a stack having at least one metal layer, a carbon layer, and at least one phase change material layer, the stack extending in a first dimension. The method includes etching the carbon layer to a first width in a second dimension, the second dimension being perpendicular to the first dimension. The method includes applying hydrogen plasma to laterally etch the carbon layer to a second width in the second dimension, the hydrogen plasma being applied with substantially no bias power and to avoid etching the at least one metal layer and the at least one phase change material layer.

This provides an improved method to trim carbon layers on a nanoscale in a stack with a high aspect ratio, and this has the technical effect of reducing the number of fabrication operations. As technical effects and advantages, the application of pure hydrogen plasma with zero bias power is to etch the carbon layer laterally by creating volatile hydrocarbons, to enable small pillar critical dimensions at deeper levels in a thick stack, ensuring that a small pillar critical dimension is maintained. Further, this method can allow for critical dimension recovery for a thick stack when the carbon layer is used as a top electrode. Also, when the carbon layer is used as the bottom electrode, trimming the carbon layer for the bottom electrode is performed such that the bottom electrode acts as a heater. This process of etching using pure hydrogen plasma is selective to the hardmask and the exposed metals. Furthermore, this process can maintain the critical dimension all the way to the bottom of the stack by trimming the carbon layer. The carbon layer can be used to etch further lower layers in the stack, using a second reactive ion etch (RIE) after the initial RIE etch to transfer the pattern of the hardmask layer to the carbon layer and after lateral etching with pure hydrogen plasma.

In addition to one or more of the features described above or below, additional features include where the substantially no bias power is a zero bias power. This advantageously allows the carbon layer to be etched without etching other layers.

In addition to one or more of the features described above or below, additional features include where the applying the hydrogen plasma laterally etches the carbon layer by creating volatile hydrocarbons from the carbon layer. This advantageously allows the carbon layer to be etched on a nanoscale without etching other layers.

In addition to one or more of the features described above or below, additional features include where a hardmask layer is utilized to etch the carbon layer to the first width in the second dimension. This advantageously prepares the carbon layer for subsequent etching on a nanoscale without etching other layers.

In addition to one or more of the features described above or below, additional features include where the applying the hydrogen plasma laterally etches the carbon layer to the second width less than the first width without etching the hardmask layer. This advantageously allows the carbon layer to be etched on a nanoscale without etching other layers.

In addition to one or more of the features described above or below, additional features include where a hardmask layer is utilized to etch the carbon layer to the first width that is less than 100 nanometers (nm) in the second dimension. This advantageously allows the carbon layer to be etched on a nanoscale without etching other layers with a reduced number of fabrication operations.

In addition to one or more of the features described above or below, additional features include where the hydrogen plasma includes substantially pure hydrogen applied at a predetermined temperature. This advantageously allows the carbon layer to be etched on a nanoscale without etching other layers.

According to one or more embodiments, a non-limiting method includes providing a structure as a stack including a first metal layer, a first carbon layer, a phase change material layer, a second carbon layer, and a second metal layer, the stack extending in a first dimension. The method includes applying hydrogen plasma to laterally etch the second carbon layer to a width in a second dimension, the hydrogen plasma being applied with substantially no bias power and to avoid etching the first and second metal layers and the phase change material layer, the second dimension being perpendicular to the first dimension. The method includes etching, using the second carbon layer having the width as a pattern, the phase change material layer and the first carbon layer to the width of the second carbon layer.

This provides an improved method to trim carbon layers on a nanoscale in a stack with a high aspect ratio, and this has the technical effect of reducing the number of fabrication operations. As technical effects and advantages, the application of pure hydrogen plasma with zero bias power is to etch the carbon layer laterally by creating volatile hydrocarbons, to enable small pillar critical dimensions at deeper levels in a thick stack, ensuring that a small pillar critical dimension is maintained. Further, this method can allow for critical dimension recovery for a thick stack when the carbon layer is used as a top electrode. Also, when the carbon layer is used as the bottom electrode, trimming the carbon layer for the bottom electrode is performed such that the bottom electrode acts as a heater. This process of etching using pure hydrogen plasma is selective to the hardmask and the exposed metals. Furthermore, this process can maintain the critical dimension all the way to the bottom of the stack by trimming the carbon layer. The carbon layer can be used to etch further lower layers in the stack, using a second reactive ion etch RIE after the initial RIE etch to transfer the pattern of the hardmask layer to the carbon layer and after lateral etching with pure hydrogen plasma.

In addition to one or more of the features described above or below, additional features include where the substantially no bias power is a zero bias power. This advantageously allows the carbon layer to be etched without etching other layers.

In addition to one or more of the features described above or below, additional features include where the applying the hydrogen plasma laterally etches the second carbon layer by creating volatile hydrocarbons from the second carbon layer. This advantageously allows the carbon layer to be etched on a nanoscale without etching other layers.

In addition to one or more of the features described above or below, additional features include where a hardmask layer is utilized to initially etch the second carbon layer to an initial width greater than the width. This advantageously prepares the carbon layer for subsequent etching on a nanoscale without etching other layers.

In addition to one or more of the features described above or below, additional features include where the applying the hydrogen plasma laterally etches the second carbon layer to the width less than the initial width without etching the hardmask layer. This advantageously allows the carbon layer to be etched on a nanoscale without etching other layers.

In addition to one or more of the features described above or below, additional features include where a hardmask layer is utilized to initially etch the second carbon layer to an initial width that is less than 100 nanometers (nm) in the second dimension. This advantageously allows the carbon layer to be etched on a nanoscale without etching other layers with a reduced number of fabrication operations.

In addition to one or more of the features described above or below, additional features include where the hydrogen plasma includes substantially pure hydrogen applied at a predetermined temperature. This advantageously allows the carbon layer to be etched on a nanoscale without etching other layers.

In addition to one or more of the features described above or below, additional features include where the first and second carbon layers act as a thermal source to the phase change material layer, in response to electrical current being applied to the stack. This advantageously allows the stack to be utilized as a memory element for storing data.

In addition to one or more of the features described above or below, additional features include where the stack includes another phase change material layer above the phase change material layer. This advantageously allows the stack to be utilized as a memory element for storing data.

According to one or more embodiments, a non-limiting method includes providing a structure as a stack including a first metal layer, a first carbon layer, a phase change material layer, a second carbon layer, and a second metal layer, the stack extending in a first dimension, where the second carbon layer is the intermediate layer in the stack and is above the phase change material layer and the first carbon layer. The method includes etching the carbon layer to a first width in a second dimension, the second dimension being perpendicular to the first dimension. The method includes applying hydrogen plasma to laterally etch the second carbon layer to a second width in the second dimension, the hydrogen plasma being applied with substantially no bias power and to avoid etching the first and second metal layers and the phase change material layer, where the phase change material layer and the first carbon layer include a different width greater than the first width. The method includes etching, using the second carbon layer having the second width as a pattern, the phase change material layer and the first carbon layer to the second width of the second carbon layer.

This provides an improved method to trim carbon layers on a nanoscale in a stack with a high aspect ratio, and this has the technical effect of reducing the number of fabrication operations. As technical effects and advantages, the application of pure hydrogen plasma with zero bias power is to etch the carbon layer laterally by creating volatile hydrocarbons, to enable small pillar critical dimensions at deeper levels in a thick stack, ensuring that a small pillar critical dimension is maintained. Further, this method can allow for critical dimension recovery for a thick stack when the carbon layer is used as a top electrode. Also, when the carbon layer is used as the bottom electrode, trimming the carbon layer for the bottom electrode is performed such that the bottom electrode acts as a heater. This process of etching using pure hydrogen plasma is selective to the hardmask and the exposed metals. Furthermore, this process can maintain the critical dimension all the way to the bottom of the stack by trimming the carbon layer. The carbon layer can be used to etch further lower layers in the stack, using a second reactive ion etch RIE after the initial RIE etch to transfer the pattern of the hardmask layer to the carbon layer and after lateral etching with pure hydrogen plasma.

In addition to one or more of the features described above or below, additional features include where the substantially no bias power is a zero bias power. This advantageously allows the carbon layer to be etched without etching other layers.

In addition to one or more of the features described above or below, additional features include where the applying the hydrogen plasma laterally etches the carbon layer by creating volatile hydrocarbons from the carbon layer. This advantageously allows the carbon layer to be etched on a nanoscale without etching other layers.

In addition to one or more of the features described above or below, additional features include where a hardmask layer is utilized to initially etch the second carbon layer to the first width that is greater than the second width, the applying the hydrogen plasma laterally etches the second carbon layer to the second width less than the first width without etching the hardmask layer, and the first width is less than 100 nm in the second dimension. This advantageously prepares the carbon layer for subsequent etching on a nanoscale without etching other layers and allows the carbon layer to be utilized as a pattern to etch lower layers.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

A phase change material (PCM) is a substance that releases/absorbs sufficient energy at phase transition to provide useful heat or cooling. Generally, the phase transition is from one of the two fundamental states of matter. The phase transition may also be between non-classical states of matter, such as the conformity of crystals, where the material changes from conforming to one crystalline structure to conforming to another crystalline structure, which may be a higher or lower energy state.

Phase change memory also known as ovonic unified memory (OUM) is a type of non-volatile random-access memory. PCM memory exploits the unique behavior of chalcogenide glass. In PCM, heat produced by the passage of an electric current through a heating element generally made of titanium nitride is used to either quickly heat and quench the glass, making it amorphous, or to hold the glass in its crystallization temperature range for some time, thereby switching it to a crystalline state. PCM also has the ability to achieve a number of distinct intermediary states, thereby having the ability to hold multiple bits in a single cell for PCM memory.

In general, a PCM memory device has a stack including a layer of phase change material sandwiched between a top electrode (TE) and a narrower bottom electrode (BE). A long low current pulse (SET) is applied to bring the PCM memory to the low resistance crystalline state. A short high current pulse (RESET) is applied to bring the PCM memory to the high resistance amorphous state. PCM memory exploits the behavior of so-called phase change materials that can be switched reversibly between amorphous and crystalline phases of different electrical resistivity. The amorphous phase tends to have high electrical resistivity, while the crystalline phase exhibits a low resistivity, sometimes three or four orders of magnitude lower. This large resistance contrast is used to store information in the PCM memory where the high resistance state can represent a logical "0" while the low resistance state can represent a logical "1".

One or more embodiments provide techniques for trimming intermediate carbon layer(s) by hydrogen ($H_2$) plasma to achieve nanometer scale critical dimension (CD) patterning with high selectivity to metals and dielectrics. Complicated and thick stacks with multiple materials suffer from CD gain during etching due to redeposition, profile tapering, etc. The CD may be the size targeted for a feature, which can be a width, diameter, and/or thickness. In these processes, the small CD transfer to deeper levels in the stack is to be performed. When carbon is an intermediate layer, the carbon layer can be trimmed to recover CD. This process can enable small pillar critical dimensions at deeper levels in the stack, ensuring a small pillar CD is achieved for deeper layers in the stack, according to one or more embodiments. If any of the materials of the stack is sensitive to $H_2$ exposure, a spacer process can precede the $H_2$ trim of the carbon layer.

In one or more embodiments, a carbon bottom electrode can be trimmed and used as a heater for the phase change material, when electrical current is applied. A small CD of the carbon heater bottom electrode can be achieved by trimming the carbon pillar. One or more embodiments include the application of pure hydrogen ($H_2$) plasma with zero bias power (0 watts bias) to etch the carbon layer laterally and create volatile hydrocarbons, thereby etching the carbon layer. In one or more embodiments, the zero bias power is less than 0.5 watts to laterally etch the carbon layer without etching other layers. In one or more embodiments, the zero bias power refers to a bias less than 1 watt, less than 2 watts, or less than 3 watts to laterally etch the carbon layer without etching other layers. In one or more embodiments, the bias power can be about 1 watt, 2 watts, or 3 watts to laterally etch the carbon layer without etching other layers. The zero bias power refers to the wafer chuck and is typically used to control the voltage between the wafer and the plasma, ultimately controlling the energy and directionality of the ions bombarding the wafer surface. The temperature of this hydrogen plasma process can be in the range 40-200° Celsius (C.). This etching with the hydrogen plasma process is selective to the hardmask (including dielectrics) and the exposed metals, thereby not etching the hardmask and metal layers while selectively etching the carbon layer (s), according to one or more embodiments.

Turning now to a more detailed description of aspects of the present invention, FIGS. 1-3 depict cross-sectional views of a flow of fabricating a structure 100. According to one or more embodiments, the flow illustrates trimming at least one intermediate carbon layer by hydrogen ($H_2$) plasma to achieve nanometer scale critical dimension patterning with high selectivity not to etch metals and dielectrics. The structure 100 can also be referred to as a pillar.

The structure 100 illustrates a stack of layers that includes a bottom electrode 102, a PCM layer 104, a thin metal layer 106, a carbon layer 108, and a hardmask layer 110. The bottom electrode 102 and thin metal layer 106 are conductive material. The bottom electrode 102 can be a metal and/or metallic material. Example metals of the bottom electrode 102 and thin metal layer 106 may include aluminum, copper, gold, silver, tungsten, zinc, etc. The carbon layer 108 only includes carbon or substantially includes carbon without other materials.

The PCM layer 104 can include germanium antimony tellurium (GeSbTe) or GST, which is a phase change material from the group of chalcogenide glasses used in rewritable optical discs and phase-change memory applications. The PCM layer 104 can include ovonic threshold switching (OTS) materials. OTS materials include germanium antimony selenium nitrogen (GeSbSeN) glassy thin films, tellurium arsenic germanium silicon (TeAsGeSi) films, etc. The hardmask layer 110 is a dielectric material and can include silicon nitride (SiN), silicon oxide (such as silicon dioxide ($SiO_2$)), etc. The PCM layer 104 can include various dielectric dopants as additives, such as silicon, silicon oxide, etc.

FIG. 1 depicts etching 120 the structure 100 using the patterned hardmask layer 110 to transfer the pattern to the carbon layer 108. The width WI of the hardmask layer 110 and the carbon layer 108 have a nanoscale dimension. In one or more embodiments, the width W1 of the hardmask layer 110 and the carbon layer 108 may be about 100 nanometers (nm), 90 nm, 80 nm, 70 nm, 60 nm, 50 nm, 40 nm, etc. The width W1 of the of the hardmask layer 110 and the carbon layer 108 may range from 20-70 nm. The etching 120 can be a directional etch such as a reactive ion etch (RIE) to etch the carbon layer 108.

FIG. 2 depicts trimming the carbon layer 108 of the structure 100 without etching the metal layer and dielectric layers in the stack and/or without causing a redeposition of carbon material on the layers in the structure 100. The hydrogen in the pure hydrogen plasma (with no oxygen) forms hydrocarbons with the carbon layer, thereby reducing the size of the carbon layer without affecting the other layers in the stack such as metal layers, dielectric layers, etc.; the hydrocarbons exit the plasma chamber thereby not redepositing on the stack. For a nanoscale stack, lateral etching 122 of the carbon layer 108 is performed as a plasma etch using pure hydrogen ($H_2$) plasma with 0 bias watts at a temperature in the range 40-200° C. with pressure at a range of about 4-100 millitorr (mTorr) for a time in a range of about 10-400 seconds(s).

After trimming, the carbon layer 108 has a smaller width W2 dimension than the width W1 dimension. The lateral etching 122 of the carbon layer 108 can laterally remove about 90 nm, 80 nm, 70 nm, 60 nm, 50 nm, 40 nm, 30 nm, etc., of carbon material from the carbon layer 108. In one or more embodiments, the lateral etching 122 can trim the carbon layer 108 by removing small amounts of carbon from the carbon layer. The lateral etching 122 can etch from about 3-60 nm from the width W1 to result in the width W2 in one or more embodiments. In one or more embodiments, the lateral etching 122 can etch small increments of material from the carbon layer 108 such as 2 nm, 3 nm, 4 nm, 5 nm, 6 nm, etc., given the controlled time for etching. It should be appreciated that the lateral etching 122 can etch carbon layers in a stack where one or more layers in the stack including, for example, the hardmask layer is already at a nanoscale dimension without requiring multiple fabrication steps, without CD gain during etching due to redeposition on the stack, without profile tapering, and without etching metal and dielectric layers. For example, in one or more embodiments, the hardmask layer 110 and the carbon layer 108 were about 60 nm in width W1 in one instance, and the lateral etching 122 was performed using pure hydrogen plasma at 0 bias watts for about 200 seconds(s) at a pressure of about 10 millitorr (mTorr) at a temperature of about 65 C to (only) trim the width W2 of the carbon layer 108 to about 35 nm.

FIG. 3 depicts removal of the hardmask layer 110 leaving the trimmed carbon layer 108 on the structure 100. The hardmask layer 110 can be removed with a wet or dry etch. Additionally, chemical mechanical polishing (CMP) may be utilized to remove the hardmask layer 110. As can be seen, FIGS. 1-3 illustrate an example of laterally trimming the width, which could be a diameter, of the carbon layer 108 without etching the dielectric layer and/or metal layer using a pure hydrogen plasma etch. There are various applications, as discussed further herein.

FIGS. 4-7 depict cross-sectional views of a flow of fabricating a structure 400 where a trimmed carbon layer is utilized to each additional layers further in the stack, where normally these layers that are further in the stack would have a tapered profile. According to one or more embodiments, the flow illustrates trimming as least one intermediate carbon layer by hydrogen plasma to achieve nanometer scale critical dimension patterning with high selectivity not to etch metals and dielectrics.

The structure 400 illustrates a stack of layers that includes a bottom electrode 102, a first carbon layer 108A on the bottom electrode 102, a first PCM layer 104A on the first carbon layer 108A, a second carbon layer 108B on the first PCM layer 104A, a first thin metal layer 106A on the second carbon layer 108B, a second PCM layer 104B on the first thin metal layer 106A, a second thin metal layer 106B on the second PCM layer 104B, a top electrode 202 on the second thin metal layer 106B, and a hardmask layer 110 on the top electrode 202.

As discussed herein, the bottom electrode 102, first and second thin metal layers 106A and 106B, and a top electrode 202 are formed of conductive material. The bottom electrode 102 and top electrode 202 can be a metal and/or metallic material. Example metals of the bottom electrode 102, top electrode 202, and first and second thin metal layer 106A and 106B may include aluminum, copper, gold, silver, tungsten, zinc, etc. The carbon layer 108 only includes carbon or substantially includes carbon.

The first and second PCM layers 104A and 104B can be the same materials or different materials. The PCM layers 104A and 104B can include germanium antimony tellurium (GeSbTe) or GST. The PCM layers 104A and 104B can include OTS materials, which include germanium antimony selenium nitrogen (GeSbSeN) glassy thin films, tellurium arsenic germanium silicon (TeAsGeSi) films, etc. In one or more embodiments, the first PCM layer 104A can be an OTS material, while the second PCM layer 104B can be a GST material, and vice versa. The PCM layers 104A and 104B can include various dielectric dopants as additives, such as silicon, silicon oxide, etc.

FIG. 4 depicts etching 220 the structure 400 using the patterned hardmask layer 110 to transfer the pattern to the second PCM layer 104B which has a tapered profile, the first thin metal layer 106A, and the second carbon layer 108B. The top electrode 202 and the second thin metal layer 106B have been etched during an earlier fabrication operation. The width W1 of the hardmask layer 110, the first thin metal layer 106A, and the second carbon layer 108B have a nanoscale dimension. In one or more embodiments, the width W1 may be about 100 nm, 90 nm, 80 nm, 70 nm, 60 nm, 50 nm, 40 nm, etc. The width W1 may range from 20-70 nm. The etching 220 can be a directional etch such as a RIE etch.

FIG. 5 depicts trimming the second carbon layer 108B of the structure 400 without etching the metal layer and dielectric layers in the stack and/or without causing a redeposition of carbon material on the other layers in the structure 400. As noted herein for a nanoscale stack, lateral etching 222 of the carbon layer 108B is performed as a plasma etch using pure hydrogen ($H_2$) plasma with 0 bias watts at a temperature in the range 40-200° C. with pressure at a range of about 4-100 mTorr for a time in a range of about 10-400 s.

After trimming, the second carbon layer 108B has a smaller width W2 dimension than the width W1 dimension. The lateral etching 222 of the second carbon layer 108B can laterally remove about 90 nm, 80 nm, 70 nm, 60 nm, 50 nm, 40 nm, 30 nm, etc., of carbon material from the second carbon layer 108B. The lateral etching 222 can trim the second carbon layer 108B by removing small amounts of carbon from the carbon layer; the lateral etching 222 can etch from about 3-60 nm from the width W1 to result in the width W2 in one or more embodiments. In one or more embodiments, the lateral etching 222 can etch small increments from the second carbon layer 108B such as 2 nm, 3 nm, 4 nm, 5 nm, 6 nm, etc., given the controlled time for etching. It should be appreciated that the lateral etching 222 can etch carbon layers in a stack where one or more layers in the stack including, for example, the hardmask layer is already at a nanoscale dimension without requiring multiple fabrication steps, without CD gain during etching due to redeposition, without profile tapering, and without etching metal and dielectric layers.

FIG. 6 depicts etching 224 to transfer the dimension (e.g., CD pattern) of the second carbon layer 108B to the layers below. The etching 224 can be a directional etch that transfers the width W2 of the second carbon layer 108B to the first PCM layer 104A and the first carbon layer 108A in the structure 400. It is noted that the bottom critical dimension of the pillar (second carbon layer 108B) helps to define the final critical dimension of the subsequently etched layers (first PCM layer 104A and first carbon layer 108A). Also, a portion of the hardmask layer 110 could be removed by CMP and/or etching prior to the etching 224.

FIG. 7 depicts the structure 400 after removal of the hardmask layer 110. The hardmask layer 110 can be removed with a wet or dry etch, and/or CMP.

Although examples have been provided for illustration purposes, any of the discussions in FIGS. 1-3 and FIGS. 4-7 can be utilized interchangeably.

Although not shown, a dielectric layer may be formed under the bottom electrode 102 and the dielectric layer is not trimmed during the pure hydrogen plasma etch.

Although not shown, the bottom electrode 102 can be on a wafer or substrate and part of an integrated circuit (IC). ICs (also referred to as a chip or a microchip) include electronic circuits on a wafer. The wafer is a semiconductor material, such as, for example, silicon or other materials. An IC is formed of a large number of devices, such as transistors, capacitors, resistors, etc., which are formed in layers of the IC and interconnected with wiring in the back-end-of-line (BEOL) layers of the wafer. on the wafer. Typical ICs are formed by first fabricating individual semiconductor devices using processes referred to generally as the front-end-of-line (FEOL). A metal-oxide-semiconductor field-effect transistor (MOSFET) is a transistor used for amplifying or switching electronic signals. The MOSFET has a source, a drain, and a metal oxide gate electrode. A conventional FET is a planar device where the entire channel region of the device is formed parallel and slightly below the planar upper surface of the semiconducting substrate. In contrast to a planar FET, there are so-called three-dimensional (3D) devices, such as a FinFET device, which is a three-dimensional structure. One type of transistor for advanced integrated circuit products of the future is generally known as a nanosheet transistor.

It should be appreciated that the structures 100 and 400 can be formed on the IC having various semiconductor devices such as transistors, capacitors, etc., and the transistors can be coupled to and control the structures 100 and 400 to work as PCM memory devices for storing data. A voltage source can be coupled to the structures 100 and 400 for storing bits and removing bits.

FIG. 8 depicts a flowchart of a method 800 of forming an intermediate carbon layer by hydrogen plasma to achieve nanometer scale critical dimension patterning with high selectivity to metals and dielectrics according to one or more embodiments.

At block 802, the method 800 includes providing a structure (e.g., structures 100 and 400) as a stack including at least one metal layer (e.g., bottom electrode 102, thin metal layers 106, 106A, and 106B, top electrode 202), a carbon layer (e.g., carbon layers 108, 108A, and 108B) and at least one phase change material layer (e.g., PCM layers 104, 104A, and 104B), the stack extending in a first dimension (e.g., y-axis).

At block 804, the method 800 includes etching (e.g., etching 120 and 220) the carbon layer (e.g., carbon layer 108) to a first width (e.g., width W1) in a second dimension (e.g., x-axis), the second dimension being perpendicular to the first dimension.

At block 806, the method 800 includes applying hydrogen plasma to laterally etch (e.g., lateral etching 122 and 222) the carbon layer (e.g., carbon layer 108) to a second width (e.g., width W2) in the second dimension, the hydrogen plasma being applied with substantially no bias power and to avoid etching the at least one metal layer and the at least one phase change material layer.

The substantially no bias power is a zero bias power (e.g., 0 bias watts, or 1, 2, 3 bias watts). The applying the hydrogen plasma laterally etches the carbon layer by creating volatile hydrocarbons from the carbon layer. A hardmask layer 110 is utilized to etch the carbon layer to the first width (e.g., width W1) in the second dimension. The applying the hydrogen plasma laterally etches the carbon layer to the second width (e.g., width W2) less than the first width (e.g., width W2) without etching the hardmask layer 110. The hardmask layer 110 is utilized to etch the carbon layer to the first width that is less than 100 nanometers (nm) in the second dimension. The hydrogen plasma includes substantially pure hydrogen ($H_2$) (i.e., without other impurities) applied at a predetermined temperature.

FIG. 9 depicts a flowchart of a method 900 of forming an intermediate carbon layer by hydrogen plasma to achieve nanometer scale critical dimension patterning with high selectivity to metals and dielectrics according to one or more embodiments.

At block 902, the method 900 includes providing a structure (e.g., structures 100 and 400) as a stack including a first metal layer (e.g., bottom electrode 102), a first carbon layer (e.g., carbon layer 108A), a phase change material layer (e.g., PCM layer 104A), a second carbon layer (e.g., carbon layer 108B), and a second metal layer (e.g., top electrode 202), the stack extending in a first dimension (e.g., y-axis).

At block 904, the method 900 includes applying hydrogen plasma to laterally etch (e.g., lateral etching 122 and 222) the second carbon layer (e.g., carbon layer 108B) to a width (e.g., width W2) in a second dimension (e.g., x-axis), the hydrogen plasma being applied with substantially no bias power and to avoid etching the first and second metal layers and the phase change material layer, the second dimension being perpendicular to the first dimension.

At block 906, the method 900 includes etching (e.g., etching 224), using the second carbon layer having the width as a pattern, the phase change material layer (e.g., PCM layer 104A) and the first carbon layer (e.g., carbon layer 108A) to the width (e.g., width W2) of the second carbon layer (e.g., carbon layer 108B).

The substantially no bias power is a zero bias power (e.g., 0 bias watts, or 1, 2, 3 bias watts). The applying the hydrogen plasma laterally etches the second carbon layer by creating volatile hydrocarbons from the second carbon layer. A hardmask layer 110 is utilized to initially etch the second carbon layer to an initial width (e.g., width W1) greater than the width (e.g., width W2). The applying the hydrogen plasma laterally etches (e.g., lateral etching 122 and 222) the second carbon layer to the width (e.g., width W2) less than the initial width (e.g., width W1) without etching the hardmask layer 110. A hardmask layer 110 is utilized to initially etch the second carbon layer to an initial width that is less than 100 nanometers (nm) in the second dimension. The hydrogen plasma includes substantially pure hydrogen (i.e., without other impurities) applied at a predetermined temperature. The first and second carbon layers (e.g., carbon layers 108A and 108B) act as a thermal source to the phase change material layer (e.g., PCM layer 104A), in response to electrical current being applied to the stack. For example, electrical wires can be coupled to the top electrode 202 and bottom electrode 102 to provide electrical current from a voltage source (not shown). The stack includes another phase change material above the phase change material (e.g., PCM layer 104B is above PCM layer 104A).

FIG. 10 depicts a flowchart of a method 1000 for forming a structure (e.g., the structure 400) using an intermediate layer (e.g., carbon layer 108, 108A, and 108B) to etch layers below.

At block 1002, the method 1000 includes providing the structure as a stack having a first metal layer (e.g., bottom electrode 102), a first carbon layer (e.g., carbon layer 108A), a phase change material layer (e.g., PCM layer 104A), a second carbon layer (e.g., carbon layer 108B), and a second metal layer (e.g., top electrode 202), the stack extending in a first dimension (e.g., y-axis), where the second carbon layer is the intermediate layer in the stack and is above the phase change material layer (e.g., PCM layer 104A) and the first carbon layer (e.g., carbon layer 108A).

At block 1004, the method 1000 includes etching (e.g., etching 120 and 220) the first carbon layer to a first width (e.g., width W1) in a second dimension (e.g., x-axis), the second dimension being perpendicular to the first dimension.

At block 1006, the method 1000 includes applying hydrogen plasma to laterally etch (e.g., lateral etching 122 and 222) the second carbon layer to a second width (e.g., width W2) in the second dimension, the hydrogen plasma being applied with substantially no bias power and to avoid etching the first and second metal layers and the phase change material layer, where the phase change material layer and the first carbon layer include a different width (e.g., width W0) greater than the first width (e.g., width W1 which is greater that width W2).

At block 1008, the method 1000 include etching (e.g., etching 224), using the second carbon layer having the second width as a pattern, the phase change material layer (e.g., PCM layer 104A) and the first carbon layer (e.g., carbon layer 108A) to the second width (e.g., width W2) of the second carbon layer.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The phrase "selective to," such as, for example, "a first element selective to a second element," means that the first element can be etched and the second element can act as an etch stop.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium, and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

As noted above, atomic layer etching processes can be used in the present invention for via residue removal, such as can be caused by via misalignment. The atomic layer etch process provide precise etching of metals using a plasma-based approach or an electrochemical approach. The atomic layer etching processes are generally defined by two well-defined, sequential, self-limiting reaction steps that can be independently controlled. The process generally includes passivation followed selective removal of the passivation layer and can be used to remove thin metal layers on the order of nanometers. An exemplary plasma-based approach generally includes a two-step process that generally includes exposing a metal such a copper to chlorine and hydrogen plasmas at low temperature (below 20° C.). This process generates a volatile etch product that minimizes surface contamination. In another example, cyclic exposure to an oxidant and hexafluoroacetylacetone (Hhfac) at an elevated temperature such as at 275° C. can be used to selectively etch a metal such as copper. An exemplary electrochemical approach also can include two steps. A first step includes surface-limited sulfidization of the metal such as copper to form a metal sulfide, e.g., $Cu_2S$, followed by selective wet etching of the metal sulfide, e.g., etching of $Cu_2S$ in HCl. Atomic layer etching is relatively recent technology and optimization for a specific metal is well within the skill of those in the art. The reactions at the surface provide high selectivity and minimal or no attack of exposed dielectric surfaces.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, the etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/ connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:
1. A method comprising:
providing a structure as a stack comprising at least one metal layer, a carbon layer, and at least one phase change material layer, the stack extending in a first dimension;
etching the carbon layer to a first width in a second dimension, the second dimension being perpendicular to the first dimension; and
applying hydrogen plasma to laterally etch the carbon layer to a second width in the second dimension, the hydrogen plasma being applied with substantially no bias power and to avoid etching the at least one metal layer and the at least one phase change material layer.
2. The method of claim 1, wherein the substantially no bias power is a zero bias power.
3. The method of claim 1, wherein the applying the hydrogen plasma laterally etches the carbon layer by creating volatile hydrocarbons from the carbon layer.
4. The method of claim 1, wherein a hardmask layer is utilized to etch the carbon layer to the first width in the second dimension.
5. The method of claim 4, wherein the applying the hydrogen plasma laterally etches the carbon layer to the second width less than the first width without etching the hardmask layer.
6. The method of claim 1, wherein a hardmask layer is utilized to etch the carbon layer to the first width that is less than 100 nanometers (nm) in the second dimension.
7. The method of claim 1, wherein the hydrogen plasma comprises substantially pure hydrogen applied at a predetermined temperature.
8. A method comprising:
providing a structure as a stack comprising a first metal layer, a first carbon layer, a phase change material layer, a second carbon layer, and a second metal layer, the stack extending in a first dimension;
applying hydrogen plasma to laterally etch the second carbon layer to a width in a second dimension, the hydrogen plasma being applied with substantially no bias power and to avoid etching the first and second metal layers and the phase change material layer, the second dimension being perpendicular to the first dimension; and

etching, using the second carbon layer having the width as a pattern, the phase change material layer and the first carbon layer to the width of the second carbon layer.

9. The method of claim 8, wherein the substantially no bias power is a zero bias power.

10. The method of claim 8, wherein the applying the hydrogen plasma laterally etches the second carbon layer by creating volatile hydrocarbons from the second carbon layer.

11. The method of claim 8, wherein a hardmask layer is utilized to initially etch the second carbon layer to an initial width greater than the width.

12. The method of claim 11, wherein the applying the hydrogen plasma laterally etches the second carbon layer to the width less than the initial width without etching the hardmask layer.

13. The method of claim 8, wherein a hardmask layer is utilized to initially etch the second carbon layer to an initial width that is less than 100 nanometers (nm) in the second dimension.

14. The method of claim 8, wherein the hydrogen plasma comprises substantially pure hydrogen applied at a predetermined temperature.

15. The method of claim 8, wherein the first and second carbon layers act as a thermal source to the phase change material layer, in response to electrical current being applied to the stack.

16. The method of claim 8, wherein the stack comprises another phase change material layer above the phase change material layer.

17. A method comprising:

providing a structure as a stack comprising a first metal layer, a first carbon layer, a phase change material layer, a second carbon layer, and a second metal layer, the stack extending in a first dimension, wherein the second carbon layer is an intermediate layer in the stack and is above the phase change material layer and the first carbon layer;

etching the first carbon layer to a first width in a second dimension, the second dimension being perpendicular to the first dimension;

applying hydrogen plasma to laterally etch the second carbon layer to a second width in the second dimension, the hydrogen plasma being applied with substantially no bias power and to avoid etching the first and second metal layers and the phase change material layer, wherein the phase change material layer and the first carbon layer comprise a different width greater than the first width; and etching, using the second carbon layer having the second width as a pattern, the phase change material layer and the first carbon layer to the second width of the second carbon layer.

18. The method of claim 17, wherein the substantially no bias power is a zero bias power.

19. The method of claim 17, wherein the applying the hydrogen plasma laterally etches the second carbon layer by creating volatile hydrocarbons from the second carbon layer.

20. The method of claim 17, wherein:

a hardmask layer is utilized to initially etch the second carbon layer to the first width that is greater than the second width;

the applying the hydrogen plasma laterally etches the second carbon layer to the second width less than the first width without etching the hardmask layer; and the first width is less than 100 nanometers (nm) in the second dimension.

\* \* \* \* \*